US006423587B1

(12) United States Patent
Chen (10) Patent No.: US 6,423,587 B1
(45) Date of Patent: Jul. 23, 2002

(54) METHOD FOR FABRICATING A MOS TRANSISTOR

(75) Inventor: Yong-Hong Chen, Miao-Li Hsien (TW)

(73) Assignee: AMIC Technology (Taiwan) Inc., Hsin-Chu Hsien (TW)

( * ) Notice: Subject to any disclaimer, the term of this patent is extended or adjusted under 35 U.S.C. 154(b) by 41 days.

(21) Appl. No.: 09/639,826

(22) Filed: Aug. 17, 2000

(30) Foreign Application Priority Data

Jul. 7, 2000 (TW) .......................................... 89113518 A (51) Int. Cl.[7] .............................................. H01L 21/338
(52) U.S. Cl. ........................................ 438/182; 438/692
(58) Field of Search ................................ 438/182, 197, 438/259, 299, 300, 302, 303, 304, 305, 306, 307, 510, 621, 680, 692

(56) References Cited

U.S. PATENT DOCUMENTS 5,434,093 A * 7/1995 Chau et al. .................. 438/692
6,100,558 A * 8/2000 Krivokapic et al. ......... 257/310
6,124,189 A * 9/2000 Watanabe et al. ........... 438/586
6,177,336 B1 * 1/2001 Lin et al. .................... 438/592
6,207,482 B1 * 3/2001 Shih et al. ................... 438/199

* cited by examiner

Primary Examiner—David Nelms
Assistant Examiner—David Nhu
(74) Attorney, Agent, or Firm—Winston Hsu (57) ABSTRACT

A semiconductor wafer has a silicon substrate, at least one active area, a shallow trench isolation positioned on the silicon substrate surrounding the active area, and a first oxide layer positioned on the substrate surface within the active area. A first conductive layer is formed in a predetermined area within the active area, then the LDD of the MOS transistor is formed in the silicon substrate that is not covered by the first conductive layer. A second oxide layer, approximately flush with the top of the first conductive layer, is formed on the surface of the semiconductor wafer, and a second conductive layer is formed on the surface of the second oxide layer. Portions of the second conductive layer and the second oxide layer are removed to ensure that the residual second conductive layer and the first conductive layer form a T-shaped gate. Finally, the source and the drain of the MOS transistor are formed on the silicon substrate within the active area.

15 Claims, 6 Drawing Sheets

METHOD FOR FABRICATING A MOS TRANSISTOR

BACKGROUND OF THE INVENTION

1. Field of the Invention

The present invention relates to a method for fabricating a metal oxide semiconductor (MOS) transistor, and more particularly, to a method for fabricating a MOS transistor that has a T-shaped gate electrode.

2. Description of the Prior Art

With the progressive development of very large scale integration (VLSI) circuits, metal-oxide semiconductor (MOS) transistors that consume less power and that can be highly integrated are widely used in both the semiconductor and electronics industries. A MOS transistor typically comprises a MOS capacitor, and two doped regions which are complementary to the substrate, called a source and a drain. When a proper voltage is applied, MOS transistors can be used as a kind of switch to control the flow of electricity through a device. As the development of integrated circuits grows ever more complex and precise, controlling the manufacturing process of MOS transistors becomes an increasingly important issue.

Figure 1:
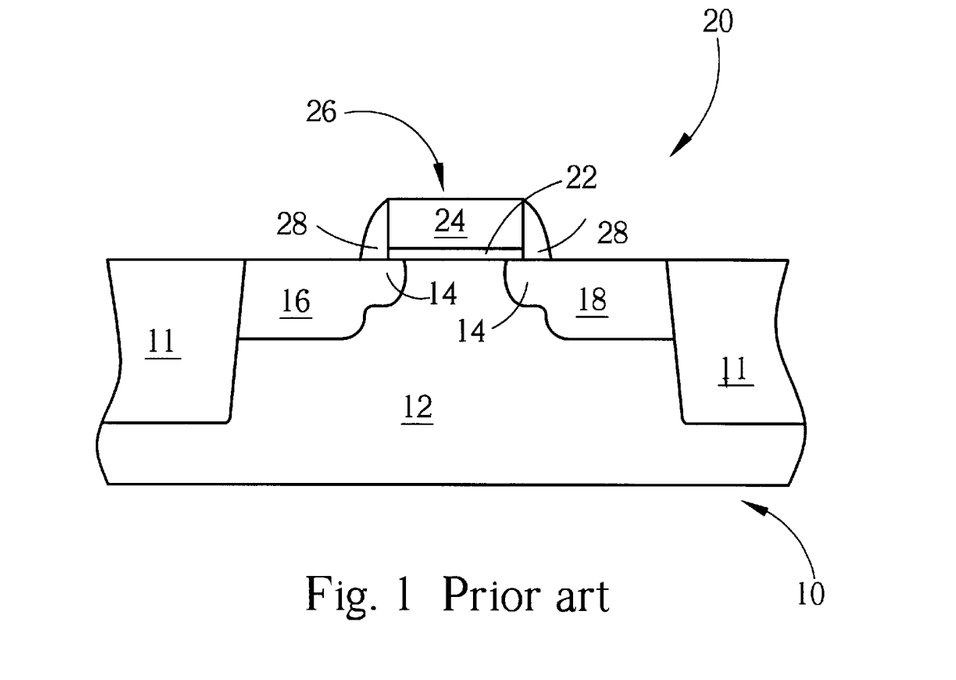
FIG. 1 is a schematic diagram of a MOS transistor according to the prior art.

Please refer to FIG. 1, which is a schematic diagram of a MOS transistor 20 according to the prior art. In the following description, an N-type MOS transistor is considered. For the prior art method of forming the MOS 20, an active area (not shown) is defined on a silicon substrate (not shown) of a semiconductor wafer 10, and then a shallow trench isolation (STI) structure 11 is formed on the silicon substrate, which surrounds the active area. P-type dopants are used to dope the semiconductor 10. A thermal process is performed to drive the dopants into the substrate so as to form a P-well 12. A thermal oxidation process and a thin film process are then performed on the semiconductor 10 to form a silicon dioxide layer and a doped polysilicon layer.

A photoresist layer (not shown) is coated onto the surface of the semiconductor wafer 10, and a photolithographic process is performed on the photoresist layer to define the pattern of a gate 26. Then a dry etching process is performed to form a gate oxide layer 22 and a gate electrode 24 of the gate 26. The photoresist layer is then stripped. An ion implantation process is performed to form lightly doped drains (LDD) 14, adjacent to the lateral sides of the gate 26 of the MOS transistor 20. A chemical vapor deposition (CVD) process is then performed to deposit a silicon nitride layer (not shown) on the semiconductor wafer 10, and an anisotropic dry etching process is performed to remove the silicon nitride layer down to the surface of the P-well 12 so as to form a spacer 28 on each lateral side of the gate 26. Using the gate 26 and the spacers 28 as hard masks, an ion implantation process is performed to dope N-type dopants into the P-well 12 so as to form a source 16 and a drain 18 of the MOS transistor 20.

However, in semiconductor processes, the the ion implantation steps, or the production of doped areas, such as P-well or N-well, are repeatedly performed on the semiconductor wafer 10 to form the MOS transistor 20 and other devices. The ion implantation process is a bombarding of ionized dopants into the semiconductor wafer 10, and during this process the edges of the top of a dielectric layer in the STI 11 may be destroyed. Additionally, before the production of the gate oxide layer 22, an SC-1 (standard cleaning 1) cleaning solution, a product of RCA (Radio Corporation of America), is usually applied to clean the surface of the semiconductor wafer 10 so as to remove impurities or poor quality silicon oxide layers. When the cleaning process is performed, the dielectric layer in STI 11, or the silicon substrate of the surface of the semiconductor wafer 10 can be damaged, especially those regions in the STI 11 destroyed by the ion implantation process.

Figure 2:
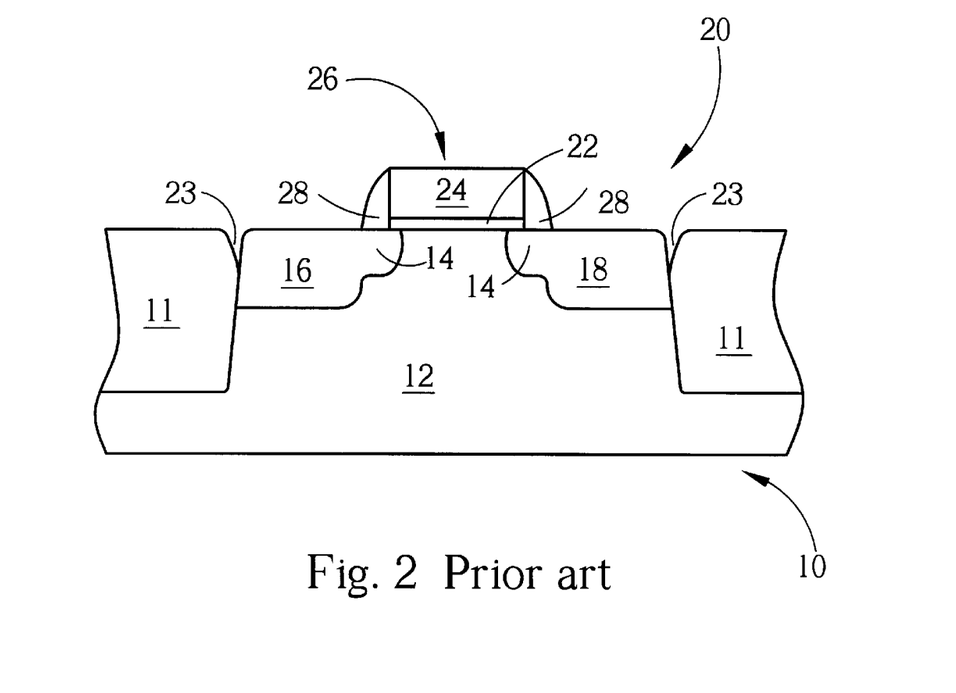
FIG. 2 is a schematic diagram of a recess generated at the edges of the top of a dielectric layer in an STI structure according to the prior art.

Please refer to FIG. 2. FIG. 2 is a schematic diagram of a recess 23 in the edge of the top of a dielectric layer filling the prior art STI 11. In the above description, to maintain the surface cleanliness of the semiconductor wafer 10, the semiconductor wafer 10 undergoes repeated cleaning steps, which creates the recess 23 at the edges of the top of the dielectric layer in the STI 11. And when an etching process is then performed on the gate 26, the doped polysilicon layer will remain in the recess 23, destroying the insulated effect of the STI 11, and adversely affecting the quality of the entire semiconductor product.

SUMMARY OF THE INVENTION

It is therefore an object of the present invention to provide a method of fabricating a MOS transistor on a semiconductor wafer so as to promote the electrical performance of the MOS transistor. The present invention also avoids the formation of recesses at the edges of the top of a dielectric layer of an STI that surrounds the MOS transistor, thus resolving the above-mentioned problem.

In a preferred embodiment, a mask layer is formed on a predetermined area within the active area, and then a first ion implantation process is performed on the silicon substrate not covered by the mask layer within the active area so as to form a lightly doped drain (LDD) of the MOS transistor. A first dielectric layer is formed on the surface of the semiconductor wafer, and a photoresist layer with a opening is formed on the surface of the first dielectric layer. An etching process is then performed through the opening of the photoresist layer so as to form a concavity with a diameter that is larger than that of the opening, and a gap with a length that is approximately equal to the diameter of the opening, on the surface of the first dielectric layer below the opening. A second dielectric layer is then formed on the surface of the silicon substrate at the bottom of the gap, and a conductive layer is deposited to fill the concavity and the gap. Portions of the conductive layer and the first dielectric layer are removed so that the residual portions form a gate conductive layer whose vertical cross-section is approximately T-shaped. Finally, a second ion implantation process is performed to form the source and the drain of the MOS transistor on the silicon substrate within the active area to complete the MOS transistor.

In another preferred embodiment of this invention, a first dielectric layer and a conductive layer are formed on a predetermined area within the active area, and then the LDD of the MOS transistor is formed on the silicon substrate that is not covered by the first conductive layer. Then a second oxide layer, which is approximately flush with the top surface of the first dielectric layer, is formed on the surface of the semiconductor wafer, and a second conductive layer is formed on the surface of the second oxide layer. Portions of the second conductive layer and the second oxide layer are removed so that the residual second conductive layer and the first conductive layer form a T-shaped gate. Finally, the source and the drain of the MOS transistor are formed on the silicon substrate within the active area to complete the MOS transistor.

It is an advantage of the present invention that it provides a process to integrate high permittivity materials serving as the gate oxide layer of the MOS transistor. The MOS transistor of the present invention has a gate conductive layer with a vertical cross-section that is approximately T-shaped, and a spacer formed through a CVD oxide layer. This reduces both the thermal budget and the parasitic capacitance between the gate and the drain or between the gate and the source. Additionally, the present invention also efficiently avoids the phenomenon of recesses generated at the edges of the top of the dielectric layer in the STI structure surrounding the MOS transistor.

These and other objectives of the present invention will no doubt become obvious to those of ordinary skill in the art after having read the following detailed description of the preferred embodiment that is illustrated in the various figures and drawings.

DETAILED DESCRIPTION OF THE PREFERRED EMBODIMENT

Figure 3:
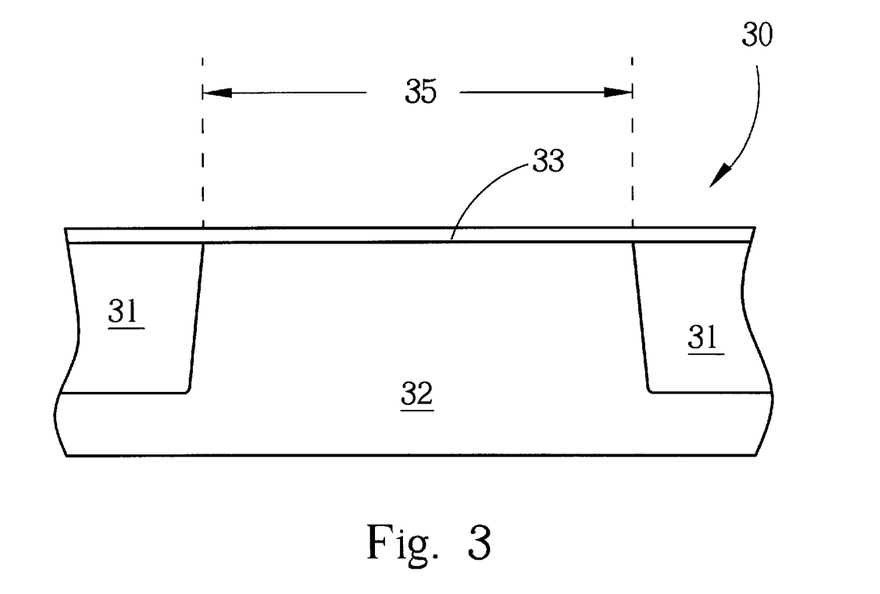
FIG. 3 to FIG. 7 are schematic diagrams of a first embodiment process for forming the MOS transistor of the present invention.

Please refer to FIG. 3 to FIG. 7, which are first embodiment schematic diagrams for forming a MOS transistor 40 according to the present invention. As shown in FIG. 3, a semiconductor wafer 30 comprises a silicon substrate 32, at least one active area 35, a shallow trench isolation (STI) structure 31 positioned on the silicon substrate 32 and surrounding the active area 35, and a first dielectric layer 33 positioned on the silicon substrate 32 of the surface within the active area 35. The first dielectric layer 33 is used as the gate oxide of the MOS 40, which is a thermal oxide formed through a thermal oxidation process, or a high permittivity material made of $Ta_2O_5$, $(Ba,Sr)TiO_3$ (BST or BSTO), $BaTiO_3$, $SrTiO_3$, $PbZrO_3$, $Pb_{1-x}La_xTiO_3$ (PLT), $Pb_{1-x}La_x(Zr_yTi_{1-y})_{1-x/4}O_3$ (PLZT), $SrBi_2Ta_2O_9$ (SBT), $SrBi_2Ta_{2-x}Nb_xO_9$ (X=0–2) (SBNT), $PbZr_{1-x}Ti_xO_3$ (PZT) or derivatives thereof, $Ba_xSr_{1-x}TiO_3$ (X=0–1) (SBT), or $(Pb,La)(Zr,Ti)O_3$ (PLT) and derivatives thereof.

Figure 4:
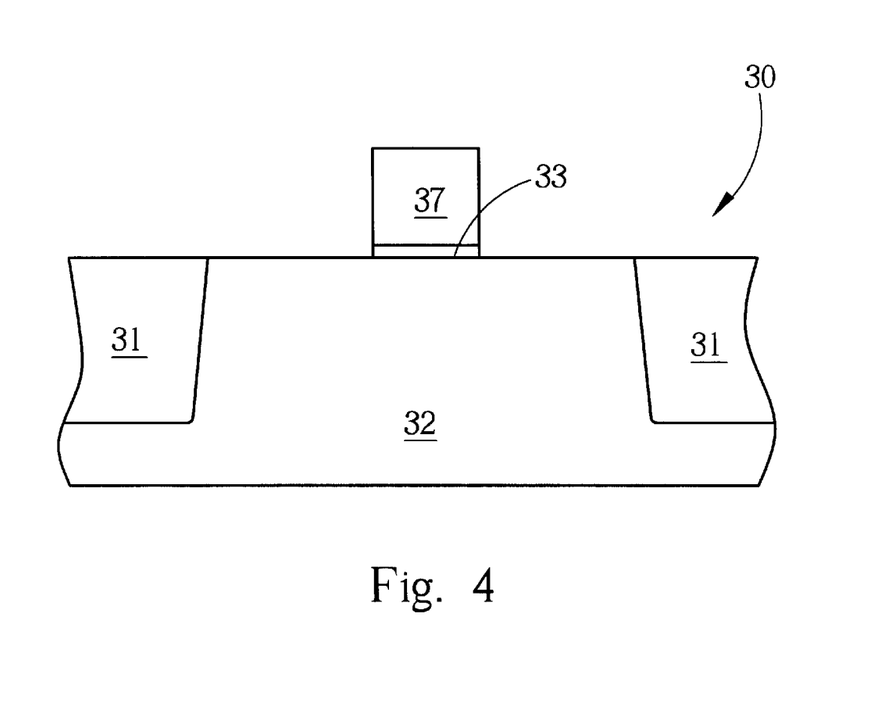

As shown in FIG. 4, a doped polysilicon layer (not shown) is deposited on the surface of the semiconductor wafer 30, onto which a photo-resist layer (not shown) is coated. A lithographic process and an etching process are performed to remove the doped polysilicon layer and the first dielectric layer 33 so as to form a first conductive layer 37 above a predetermined area within the active area 35. The first conductive layer can also be made of a highly conductive metal silicide or metal.

Figure 5:
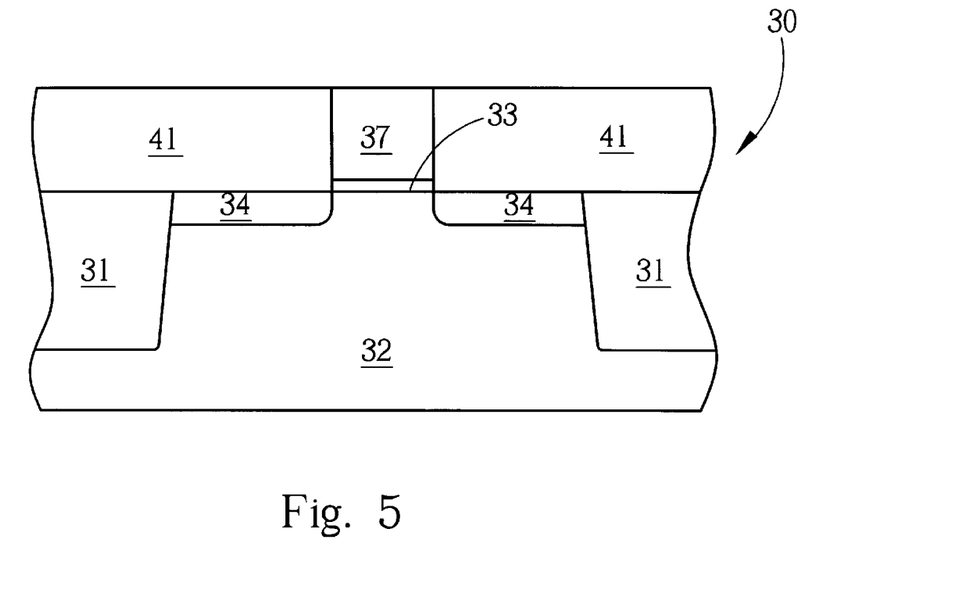

Then as shown in FIG. 5, using the first conductive layer 37 as a hard mask, a first ion implantation process is performed within the active area 35 on the silicon substrate 32 that is not covered by the first dielectric layer 37 to form lightly doped drains (LDD) 34 of the MOS transistor 40. A plasma-enhanced chemical vapor deposition (PECVD) is performed on the surface of the semiconductor wafer 30 to form a second dielectric layer 41. A chemical mechanical polishing (CMP) process is then performed so that the surface of the second dielectric layer 41 is flush with the top surface of the first conductive layer 37. To assist with the CMP process, when the doped polysilicon layer is deposited, an additional silicon nitride layer can be deposited over the doped polysilicon layer so that the first conductive layer 37 has a stop layer for the CMP process. After the CMP process, the silicon nitride layer can be removed.

Figure 6:
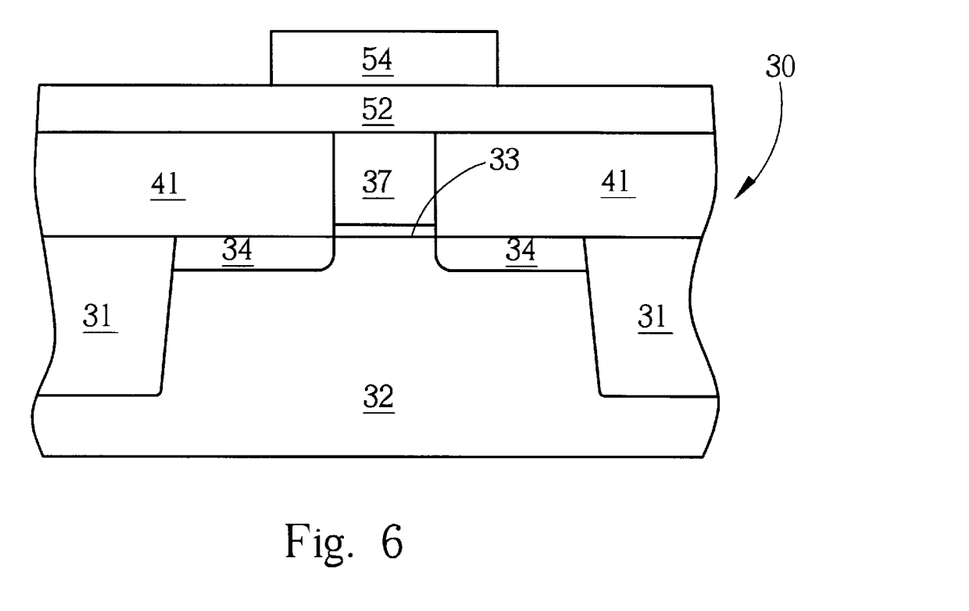

As shown in FIG. 6, a second conductive layer 52, made of doped polysilicon or highly conductive metallic silicide or metal, is formed on the surface of the second dielectric layer 41. The second conductive layer 52 contacts the top surface of the first conductive layer 37. A photo resist layer (not shown) is coated on the surface of the second conductive layer 52, and a lithographic process is performed on the photoresist layer to define the gate pattern 54 of the MOS transistor 40. Then, using the gate pattern 54 of the photoresist layer as a hard mask, an etching process is performed to remove portions of the second conductive layer 52 and the second dielectric layer 41. The residual portions of the second conductive layer 52 and the first conductive layer 37 form a gate conductive layer 44 whose vertical cross-section is approximately T-shaped.

Figure 7:
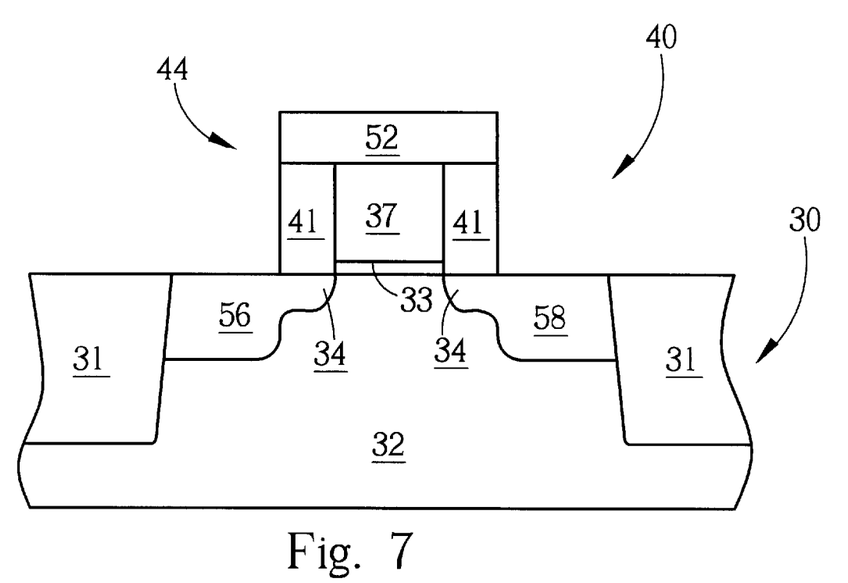

Finally as shown in FIG. 7, after removing the gate pattern 54, a second ion implantation process is performed using the gate conductive layer 44 as a mask layer to form the source 56 and the drain 58 of the MOS transistor 40 on the silicon substrate 32 within the active area 35. The process of forming the MOS transistor 40 is then completed.

Figure 8:
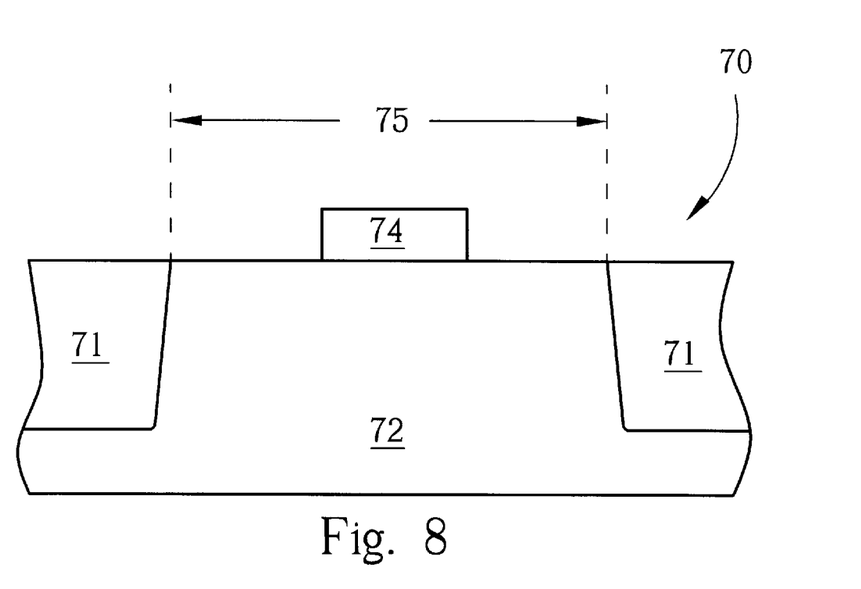
FIG. 8 to FIG. 11 are schematic diagrams of a second embodiment process for forming the MOS transistor of the present invention.

Please refer to FIG. 8 to FIG. 11. FIG. 8 to FIG. 11 are schematic diagrams of a second embodiment process of the present invention. As shown in FIG. 8, a semiconductor wafer 70 comprises a silicon substrate 72, at least one active area 75, a shallow trench isolation (STI) structure 71 positioned on the silicon substrate 72 and surrounding the active area 75, and a mask layer 74 positioned on a predetermined area within the active area 75. The mask layer 74 is an oxide layer, a silicon nitride layer, or a polysilicon layer formed by a chemical vapor deposition (CVD) process, and defines the position the lightly doped drain (LDD) 76 and the gate oxide layer 92 of the MOS 80.

Figure 9:
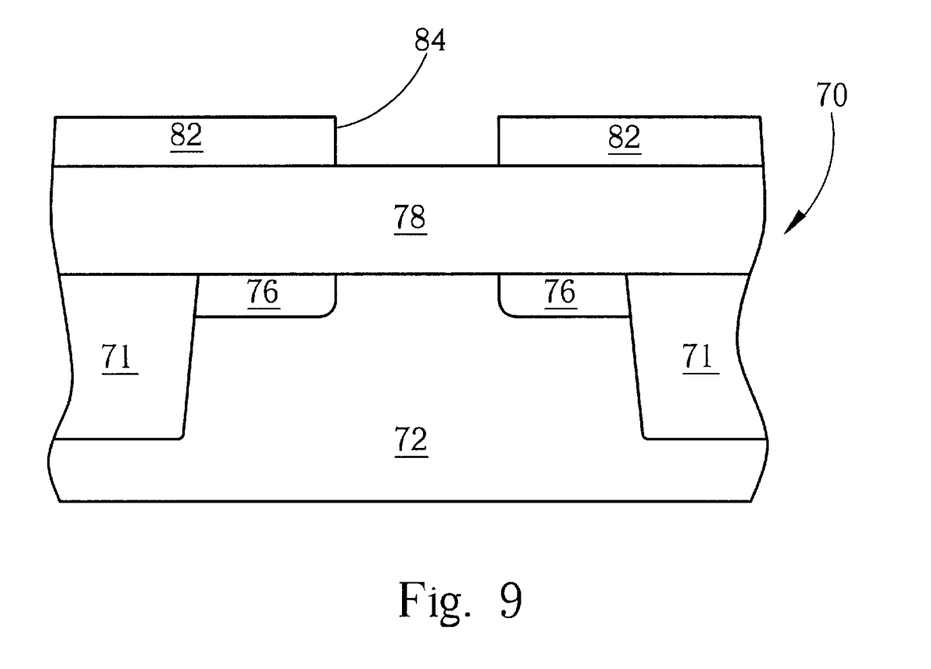

As shown in FIG. 9, a first ion implantation process is performed within the active area 75 on the silicon substrate 72 that is not covered by the mask layer 74 to form the lightly doped drains (LDD) 76 of the MOS transistor 80. The mask layer 74 is then removed and a plasma-enhanced chemical vapor deposition (PECVD) is performed on the surface of the semiconductor wafer 70 to form an oxide layer that serves as a first dielectric layer 78. A photoresist layer 82 is then coated on the surface of the first dielectric layer 78. A lithography process is performed on the photoresist layer 82 to form an opening 84 to define the gate pattern of the MOS transistor 80.

Figure 10:
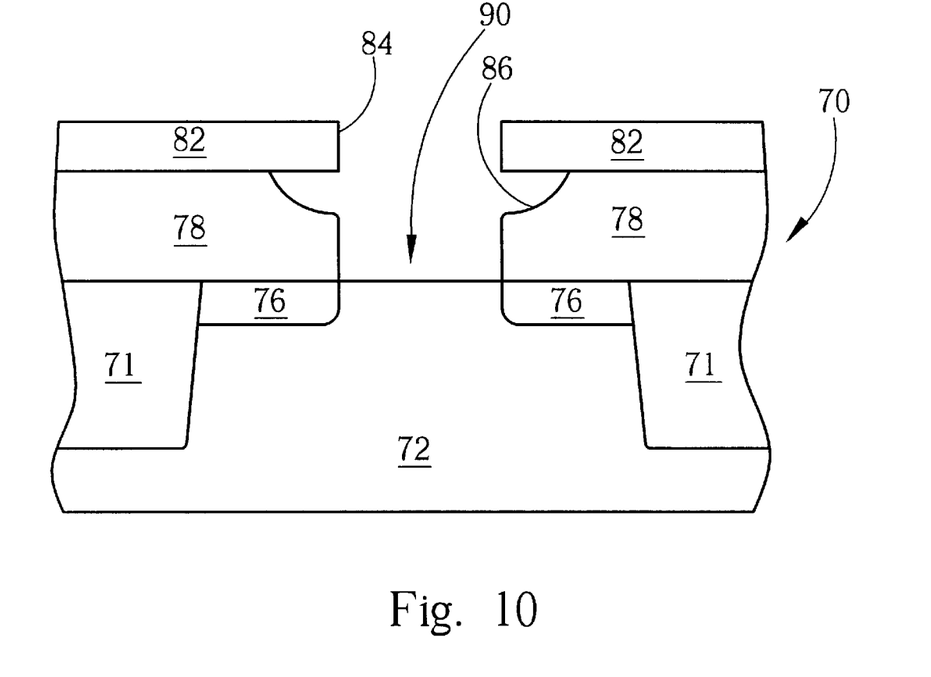

As shown in FIG. 10, the photo-resist layer 82 serves as a hard mask, and an isotropic etching process is performed through the opening 84 of the photoresist layer 82 so as to form a concavity 86 in the dielectric layer 78. The diameter of the concavity 86 is a little larger than the opening 84. Then, an anisotropic etching process is performed through the opening 84 of the photoresist layer 82 on the bottom of the concavity 86, to etch down to the surface of the silicon substrate 72 so as to form a gap 90. The length of the gap 90 in the first dielectric layer 78 at the bottom of the concavity 86 is approximately equal to the diameter of the opening 84. The photoresist layer 82 is then removed.

Figure 11:
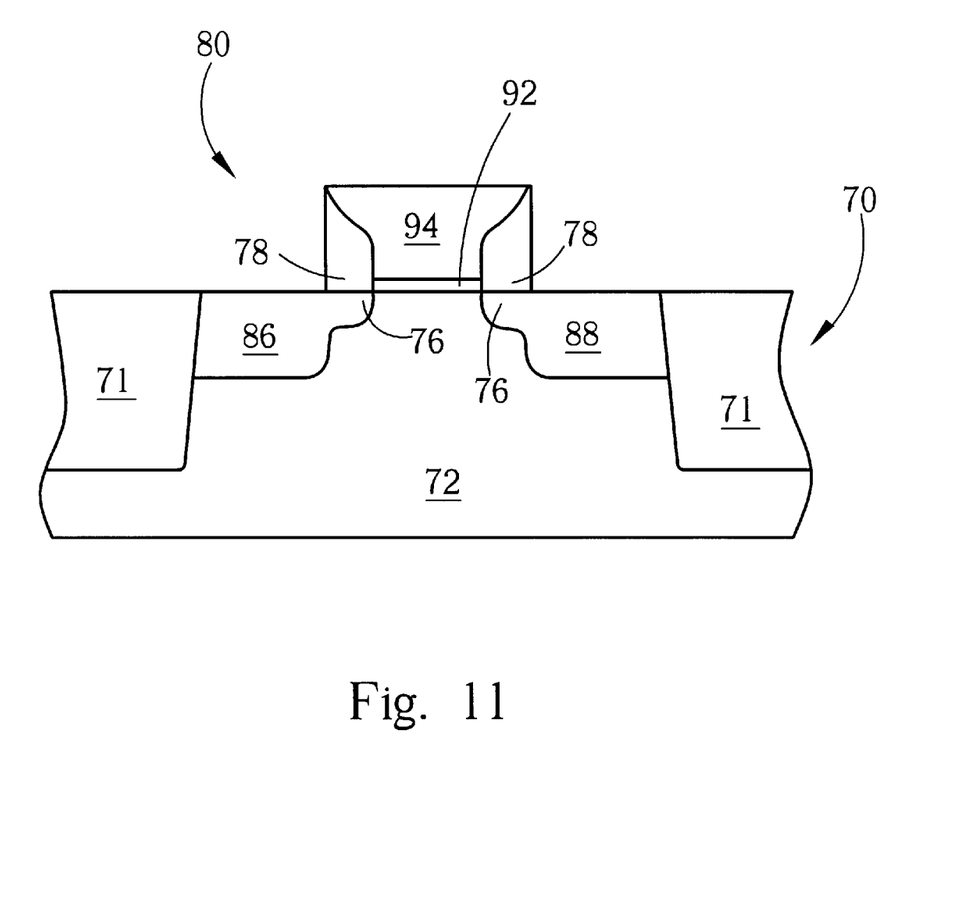

As shown in FIG. 11, under a thermal oxidation process, the surface of the silicon substrate 72 at the bottom of the gap 90 directly produces a second dielectric layer that serves as the gate oxide layer 92, or forms a barrier layer on the surface of the silicon substrate 72 at the bottom of the gap 90, and the second dielectric layer made of $Ta_2O_5$, (Ba,Sr)$TiO_3$ (BST or BSTO), $BaTiO_3$, $SrTiO_3$, $PbZrO_3$, $Pb_{1-x}La_xTiO_3$ (PLT), $Pb_{1-x}La_x(Zr_yTi_{1-y})_{1-x/4}O_3$ (PLZT), $SrBi_2Ta_2O_9$ (SBT), $SrBi_2Ta_{2-x}Nb_xO_9$ (X=0–2) (SBNT), $PbZr_{1-x}Ti_xO_3$ (PZT) or derivatives thereof, $Ba_xSr_{1-x}TiO_3$ (X=0–1) (SBT), or (Pb,La) (Zr,Ti)$O_3$) (PLT) and derivatives of high permittivity, serving as the gate oxide 92.

Finally, a conductive layer (not shown), made of doped polysilicon, metallic silicide or metal, is formed on the surface of the semiconductor wafer 70. The conductive layer fills the concavity 86 and the gap 90. The first dielectric layer 78 then serves as a barrier layer to perform a chemical-mechanical polishing process so as to make the surface of the conductive layer on the concavity 86 and the gap 90 flush with the top surface of the first dielectric layer 78. An etching process is performed through the conductive layer remaining on the concavity 86 and the gap 90, which serves as a hard mask, to remove portions of the first dielectric layer 78. The residual conductive layer forms a gate conductive layer 94 whose vertical cross-section is approximately T-shaped. A second ion implantation process is performed on the silicon substrate 72 within the active area 75, the gate conductive layer 94 serving as a hard mask, to form the source 86 and the drain 88 of the MOS transistor 80. The MOS transistor 80 is then completed.

The process steps performed to form the MOS transistor 40, 80 are changed to form the gate conductive layer 44, 94 whose vertical cross-section is approximately T-shaped. The lateral spacer of the MOS transistor 40, 80 is formed from the oxide layer of a chemical vapor deposition (CVD) process, so the MOS transistor 40, 80 does not require an additional deposition of silicon nitride to form a spacer. The thermal budget is thus decreased. Additionally, the permittivity of the spacer formed from the oxide layer of a CVD process is smaller than that of the spacer formed from silicon nitride. Hence, parasitic capacitance between the gate and the drain, or between the gate and the source, is decreased to a great extent. Furthermore, the present invention provides a process that integrates a high permittivity material to serve as the gate oxide to form the MOS transistor.

In contrast to the prior art method of forming a MOS transistor, in the method of forming a MOS transistor according to the present invention, the process steps are changed to reduce the corrosion and destruction of the surface of the semiconductor wafer 30, 70 caused by the cleaning solution SC-1. Most notably, during the step of the process to form the MOS transistor 80 through the cover of the first dielectric layer 78, the cleaning solution, which is used to remove impurities or poor quality silicon oxide, does not contact the dielectric layer of the shallow trench isolation (STI) structure 71 or the silicon substrate 72 on the surface of the semiconductor wafer 70. Thus, the formation of recesses at the edges of the top of the dielectric layer in the STI structure 71 is avoided.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method for fabricating a metal oxide semiconductor (MOS) transistor on a semiconductor wafer, the semiconductor wafer comprising a silicon substrate, at least one active area, a shallow trench isolation (STI) area positioned on the silicon substrate and surrounding the active area, and a first dielectric layer positioned on the surface of the silicon substrate, the method comprising:

forming a first conductive layer on a predetermined area of the active are;

performing a first ion implantation process to form an LDD (light doped drain) of the MOS transistor in the silicon substrate within the active area, the LDD not covered by the first conductive layer;

forming a second dielectric layer on the semiconductor wafer, the top surface of the second dielectric layer approximately flush with the top surface of the first conductive layer;

forming a second conductive layer on the second dielectric layer, and the second conductive layer contacting the first conductive layer;

performing an etching process to remove portions of the second conductive layer and the second dielectric layer, the residual portions of the second conductive layer and the first conductive layer forming a gate electrode layer with a vertical cross-section that is approximately T-shaped; and performing a second ion implantation process to form a source and a drain of the MOS transistor in the silicon substrate within the active area so as to complete the MOS transistor.

2. The method of claim 1 wherein the first conductive layer is made of doped polysilicon, silicide, or metal.

3. The method of claim 1 wherein the second conductive layer is made of doped polysilicon, silicide, or metal.

4. The method of claim 1 wherein the first dielectric layer is an oxide layer formed by a thermal oxidation process.

5. The method of claim 1 wherein the first dielectric layer is made of $Ta_2O_5$, (Ba,Sr)$TiO_3$ (BST or BSTO), $BaTiO_3$, $SrTiO_3$, $PbZrO_3$, $Pb_{1-x}La_xTiO_3$ (PLT), $Pb_{1-x}La_x(Zr_yTi_{1-y})_{1-x/4}O_3$ (PLZT), $SrBi_2Ta_2O_9$ (SBT), $SrBi_2Ta_{2-x}Nb_xO_9$ (X=0–2) (SBNT), $PbZr_{1-x}Ti_xO_3$ (PZT) or derivatives thereof, $Ba_xSr_{1-x}TiO_3$ (X=0–1) (SBT), or (Pb,La) (Zr,Ti)$O_3$) (PLT) and derivatives thereof.

6. The method of claim 1 wherein the second dielectric layer is an oxide layer formed by a plasma-enhanced chemical vapor deposition (PECVD) process.

7. The method of claim 1 wherein the method further comprises a chemical mechanical polishing (CMP) process after forming the second dielectric layer to approximately level the top surface of the second dielectric layer with the top surface of the first conductive layer.

8. The method of claim 7 wherein the surface of the first conductive layer further comprises a silicon nitride layer, the silicon nitride layer serving as a stop layer during the CMP process, the silicon nitride layer being removed prior to forming the second conductive layer.

9. A method for fabricating a metal oxide semiconductor (MOS) transistor on a semiconductor wafer, the semiconductor wafer comprising a silicon substrate, at least one active area, and a shallow trench isolation (STI) area positioned on the silicon substrate and surrounding the active area, the method comprising:

forming a mask layer on a predetermined area of the active are;

performing a first ion implantation process to form an LDD (light doped drain) of the MOS transistor in the silicon substrate within the active area, the LDD not covered by the mask layer;

forming a first dielectric layer on the semiconductor wafer;

forming a photoresist layer with an opening on the first dielectric layer;

performing an isotropic process to etch the first dielectric layer through the opening of the photoresist layer so as to form a concavity whose diameter is larger than the diameter of the opening in the photoresist layer;

performing an anisotropic etching process to etch the first dielectric layer at the bottom of the concavity through the opening of the photoresist layer down to the surface of the silicon substrate so as to form a gap in the first dielectric layer below the bottom of the concavity, the length of the gap being approximately equal to the diameter of the opening;

forming a second dielectric layer on the surface of the silicon substrate at the bottom of the gap;

forming a conductive layer on the semiconductor wafer, the conductive layer filling the concavity and the gap;

performing an etching process to remove portions of the conductive layer and the first dielectric layer, the residual portions of the conductive layer forming a gate electrode layer with a vertical cross-section that is approximately T-shaped; and performing a second ion implantation process to form a source and a drain of the MOS transistor in the silicon substrate within the active area so as to complete the MOS transistor.

10. The method of claim 9 wherein the mask layer is an oxide layer.

11. The method of claim 9 further comprising a stripping process to remove the mask layer before forming the first dielectric layer.

12. The method of claim 9 wherein the first dielectric layer is an oxide layer formed by a plasma-enhanced chemical vapor deposition (PECVD) process.

13. The method of claim 9 wherein the second dielectric layer is made of $Ta_2O_5$, $(Ba,Sr)TiO_3$ (BST or BSTO), $BaTiO_3$, $SrTiO_3$, $PbZrO_3$, $Pb_{1-x}TiO_3$ (PLT), $Pb_{1-x}La_x(Zr_yTi_{1-y})_{1-x/4}O_3$ (PLZT), $SrBi_2Ta_2O_9$ (SBT), $SrBi_2Ta_{2-x}Nb_xO_9$ (X=0–2) (SBNT), $PbZr_{1-x}Ti_xO_3$ (PZT) or derivatives thereof, $Ba_xSr_{1-x}TiO_3$ (X=0–1) (SBT), or $(Pb,La)(Zr,Ti)O_3$ (PLT) and derivatives thereof.

14. The method of claim 9 wherein the conductive layer is made of doped polysilicon, silicide, or metal.

15. The method of claim 9 wherein the method further comprises a chemical mechanical polishing (CMP) process after forming the conductive layer to ensure that the top surface of the conductive layer inside the concavity and the gap is approximately flush with the top surface of the first dielectric layer.

* * * * *